United States Patent
Gossmann et al.

(10) Patent No.: US 6,359,950 B2
(45) Date of Patent: Mar. 19, 2002

(54) DIGITAL PLL (PHASE-LOCKED LOOP) FREQUENCY SYNTHESIZER

(75) Inventors: Timo Gossmann, München; Edmund Götz, Dachau, both of (DE)

(73) Assignee: Infineon Technologies., Munich (DE)

( * ) Notice: Subject to any disclaimer, the term of this patent is extended or adjusted under 35 U.S.C. 154(b) by 0 days.

(21) Appl. No.: 09/799,669

(22) Filed: Mar. 5, 2001

Related U.S. Application Data

(63) Continuation of application No. PCT/DE99/01569, filed on May 28, 1999.

(30) Foreign Application Priority Data

Sep. 3, 1998 (DE) .......................................... 198 40 241

(51) Int. Cl.[7] .............................. H03D 3/24; H03L 7/06
(52) U.S. Cl. ........................ 375/376; 327/156; 327/158; 331/DIG. 2
(58) Field of Search ................................. 375/376, 374; 327/156, 158, 147, 149; 331/DIG. 2

(56) References Cited

U.S. PATENT DOCUMENTS

| 4,409,564 A | 10/1983 | Lo |
| 4,472,685 A * | 9/1984 | Dutasta ........................ 329/50 |
| 4,697,156 A | 9/1987 | Rudolph |
| 5,495,206 A | 2/1996 | Hietala |
| 5,907,253 A | 5/1999 | Davis et al. |

FOREIGN PATENT DOCUMENTS

| GB | 2 107 142 A | 4/1983 |
| GB | 2 140 232 A | 11/1984 |
| WO | WO 86/07219 | 12/1986 |

OTHER PUBLICATIONS

Cosmo Little: "Fractional–N synthesisers", Electronics World, Mar. 1996, pp. 196–199.

* cited by examiner

Primary Examiner—Temesghen Ghebretinsae
(74) Attorney, Agent, or Firm—Herbert L. Lerner; Laurence A. Greenberg; Werner H. Stemer

(57) ABSTRACT

The circuit compensates for phase error in the case of fractional-N-based PLL frequency synthesizers. All required actuating and reference signals are derived from the VCO frequency of the voltage-controlled oscillator by using an auxiliary phase-locked loop. The circuit is specifically applicable for HF-PLL frequency synthesizers using integrated circuit technology.

9 Claims, 2 Drawing Sheets

DIGITAL PLL (PHASE-LOCKED LOOP) FREQUENCY SYNTHESIZER

CROSS-REFERENCE TO RELATED APPLICATION

This is a continuation of copending International Application PCT/DE99/01569, filed May 28, 1999, which designated the United States.

BACKGROUND OF THE INVENTION

1. Field of the Invention

The invention relates to a digital PLL (Phase-Locked Loop) frequency synthesizer, in which a reference frequency formed by the division of a stable quartz oscillator frequency is compared with a second frequency, derived by dividing the frequency of a voltage-controlled oscillator, in a phase-frequency detector whose output signal serves, after being led via an optionally provided charge pump and a loop low-pass filter in the PLL loop, as control voltage for the voltage-controlled oscillator. For the purpose of dividing the frequency of the voltage-controlled oscillator there is provided in the PLL loop an N/(N+1) frequency divider, which can be switched over between two adjacent integral divisor factors N and N+1, divides by N for the duration of M–K cycles, and then divides by N+1 for the duration of K cycles. For the purpose of causing automatic switching over of the N/(N+1) frequency divider there is provided a phase accumulator to whose contents the value K with a modulo-M addition is added with each pulse of the divided VCO frequency and which causes a change in the divisor factor from N to N+1 in the next cycle after each overflow.

Conventional digital PLL frequency synthesizers operate using the known principle illustrated in the form of a block diagram in FIG. 1. There, a reference frequency $f_{Ref}$, which is formed by downward division of a stable quartz frequency $f_Q$ generated with the aid of a crystal-controlled oscillator 1, by the divisor factor 'R' with the aid of a reference frequency divider 2, is compared in a phase-frequency detector 3 with a second frequency $f_2$ which is derived by dividing a frequency $f_{VCO}$ generated in a voltage-controlled oscillator (VCO) 4 by the divisor factor N. This frequency division by the divisor factor 'N' is performed in an N-frequency divider 5. The phase-frequency detector 3 generates—depending on the design together with a charge pump 6—and a loop low pass filter 7, the control voltage which causes the voltage-controlled oscillator 4 to oscillate at a desired frequency $f_{VCO}$.

The divider ratio 'N', which can be set by the N-frequency divider 5, is integral, which means that the voltage-controlled oscillator 4 can oscillate only at an integral multiple of the reference frequency $f_{Ref}$ when the phase-locked loop is locked. This fact is attended by some disadvantages.

A low reference frequency $f_{Ref}$ must be used for a desired small spacing between the frequencies $f_{VCO}$ which can be generated in the voltage-controlled oscillator 4. Since the phase-locked loop PLL constitutes a sampled system with the sampling frequency $f_{Ref}$, the sampling theorem (Nyquist theorem) can be used to obtain a stable system by selecting the bandwidth of the phase-locked loop PLL to be not higher than $f_{Ref}/2$. In practice, the bandwidth is usually at approximately 10% of the reference frequency $f_{Ref}$.

However, a small PLL bandwidth means a slow transient response upon switching over the N-frequency divider 5 in order to set another frequency $f_{VCO}$ of the voltage-controlled oscillator 4, that is to say another frequency channel.

Another disadvantage stems from the fact that the frequency $f_{VCO}$ of the voltage-controlled oscillator 4 must be divided very far downward. Since the divided frequency $f_{VCO}$ is compared with the reference frequency $f_{Ref}$, which must have low phase noise, although the phase noise of the divided frequency $f_{VCO}$ is optimized by the PLL control, the phase noise of the voltage-controlled oscillator 4 itself is worsened as the divisor factor 'N' increases.

A reference frequency $f_{Ref}$ which is higher than the required channel allocation, can be used whenever the divisor factor 'N' can no longer be set integrally. Since the N-frequency divider 5 itself can divide only by integral factors, the fractional divider ratio must be set as the time average over M cycles, that is to say it is necessary to divide by the divisor factor 'N' for the duration of M–K cycles, and then to divide by the divisor factor 'N+1' increased by the whole number '1' for the duration of K cycles.

The result of this in the case of a steady-state phase-locked loop PLL is a mean frequency $f_{VCO}$ of the voltage-controlled oscillator 4 of:

$$f_{VCO} = f_{Ref} * (N+K/M).$$

Starting from a stable frequency $f_{VCO}$, set in accordance with the desired fractional divider ratio, of the voltage-controlled oscillator 4, it can be shown that the frequency $f_{VCO}/N$ is too high during the cycles in which division is by the divisor factor 'N', and that therefore the phase difference between the reference frequency $f_{Ref}$ and the frequency $f_{VCO}/N$ is increased by the factor $$T_{VCO-setpoint} * K/M$$

at each pass.

This accumulated phase difference grows to a maximum of one VCO period of the voltage-controlled oscillator 4, and is raised again overall precisely in those cycles in which division is by the divisor factor 'N+1', with the result that after M periods of the reference frequency $f_{Ref}$ phase coincidence prevails again between the reference frequency $f_{Ref}$ and the divided frequency $f_{VCO}$. The factor M is the modulus, that is to say the greater the factor M, the higher it is possible to select the reference frequency $f_{Ref}$, and the smaller the frequency steps, that is to say the smaller the frequency channel spacings can be set.

Circuit proposals are known which permit a phase accumulator to be used to switch over the divisor factor of the N/(N+1) divider automatically. The value K with a modulo-M addition can be added again to the contents in a phase accumulator after each pulse of the divided frequency $f_{VCO}$ from the voltage-controlled oscillator. After each overflow of the phase accumulator, the divisor factor of 'N' is changed to 'N+1' in the next cycle. It is implicit therefrom that the phase accumulator always has a value which, when multiplied by the factor $T_{VCO-setpoint}/M$ represents the current phase value at the phase-frequency detector.

Because of the phase difference which is set up at the phase-frequency detector in each cycle, the PLL will, however, attempt to keep correcting the voltage-controlled oscillator (VCO), and will therefore have a negative influence on the phase stability. Consequently, a constant VCO frequency and VCO phase require a constant control voltage at the voltage-controlled oscillator, and thus a large time constant of the loop low pass filter, and this precisely contradicts the desire for a larger loop bandwidth.

Various approaches to a solution have become known for the purpose of achieving a reduction in phase jitter. One such prior art method (from the Marconi company) consists in using a plurality of cascaded phase accumulators which use the sigma-delta principle to drift the frequency components of the phase jitter into regions which are strongly damped by the loop low pass filter. No compensation is then required anymore. However, a plurality of phase accumulators are required.

Another prior art method for reducing phase jitter is active compensation of control by interventions at the phase-frequency detector or at the loop low pass filter. In this case, for example, it is possible in addition to the actual charge pump current to feed a compensation current into the loop low pass filter in order to compensate the effect of the first-named current. In this case, it is necessary to vary either the magnitude or the duration of the feed from cycle to cycle, in order to make available for compensation purposes a charge quantity dependent on the phase error.

The individual graduations of the different charge quantities depend on the desired frequency $f_{VCO}$ of the voltage-controlled oscillator and can, for example, be set as a function of a reference current which depends on the VCO frequency/period. The current compensation principle is used in the case, for example, of the so-called fractional-N phase locked loops (PLLs) built by the Philips company. The disadvantage of this method resides in the need to set the reference current and in interfering at the loop low pass filter through an extended charge pump.

Another prior art method for reducing phase jitter, which is used by the National Semiconductor company, is the cycle-dependent active delaying of the active edge of the divided frequency $f_{VCO}$ of the voltage-controlled oscillator. For this reason, the phase-frequency detector is always conveyed phase coincidence, and adjustment of the phase-locked loop PLL is avoided. The relative magnitude of the required time delays is monitored with the aid of the contents of the phase accumulator. Only the absolute magnitude of the minimum time delay is dependent, in turn, on the desired frequency $f_{VCO}$ of the voltage-controlled oscillator.

With the exception of the above-mentioned method used by the Marconi company, for reducing phase jitter, it is common to all these known methods that they require a reference in the domain either of time or of voltage and/or current, the magnitude of which is a function of the frequency to be synthesized.

SUMMARY OF THE INVENTION

The object of the present invention is to provide a digital, fractional-N phase-locked loop synthesizer which overcomes the above-noted deficiencies and disadvantages of the prior art devices and methods of this general kind, and which enables phase-error compensation and wherein all the required actuating and reference signals can be derived from the frequency $f_{VCO}$ of the voltage-controlled oscillator (VCO).

With the above and other objects in view there is provided, in accordance with the invention, a digital PLL frequency synthesizer, comprising:

an input receiving a signal having a stable quartz oscillator frequency;

a voltage-controlled oscillator outputting a VCO frequency;

a first PLL loop connected to an output of the voltage-controlled oscillator and an N/(N+1) frequency divider connected in the first PLL loop for dividing the VCO frequency and generating a divided VCO frequency;

a phase-frequency detector having a first input receiving the stable quartz oscillator frequency and a second input receiving the divided VCO frequency, and configured to compare the quartz oscillator frequency with the second frequency, and outputting an output signal connected as a control voltage for the voltage-controlled oscillator;

the N/(N+1) frequency divider being configured to be switched over between two adjacent integral divisor factors N and N+1, to divide by N for a duration of M–K cycles, and to divide by N+1 for a duration of K cycles;

a phase accumulator connected to the N/(N+1) frequency divider for automatically switching the N/(N+1) frequency divider, wherein a content of the phase accumulator has added thereto the value K with a modulo-M addition with each pulse of the divided VCO frequency and the phase accumulator causing a change in the divisor factor from N to N+1 in a next cycle after each overflow;

a PLL phase delay device connected between the N/(N+1) frequency divider and the second input of the phase frequency detector and to the phase accumulator, the phase delay device containing M–1 time-delay elements in a phase delay chain and having first and second control inputs, the first control input for setting a respectively corresponding magnitude of a fundamental delay of each the time-delay element of the phase delay chain, and the second control input for setting a number of the fundamental delays to be active in the phase delay chain, wherein the contents of the phase accumulator are increased with each output pulse of the phase delay device by the adjustable fraction K of the reference frequency modulo-M, and wherein, in event of an overflow, the N/(N+1) frequency divider is switched to N+1 for a next period;

the phase accumulator having an output connected to the second control input of the phase delay device;

a further phase frequency detector having a first input, a second input connected to the output of the voltage-controlled oscillator without an interposition of a time-delay element, and an output;

a further phase delay device for simulating corresponding time-delay conditions, configured identically to the PLL phase delay device, but having a number M series-connected time-delay elements, and connected between the output of the voltage-controlled oscillator and the first input of the further phase-frequency detector; and a further loop low pass filter connected between the output of the further phase frequency detector and the first input of the PLL phase delay device and a control input of the further phase delay device for forming an auxiliary PLL and for setting a respectively corresponding magnitude of the fundamental delays of the time-delay elements of the PLL phase delay device and the further phase delay device.

In accordance with an added feature of the invention, a charge pump and a loop low-pass filter are connected in the first PLL loop.

In accordance with an additional feature of the invention, the second control input for setting the number of the fundamental delays active in the phase delay device is formed by a control input of an M:1 multiplexer, whereby the multiplexer selects, in dependence on a control signal present at a control input thereof, the output signal of which of the series-connected time-delay elements is decoupled and fed to the second in put of the first phase-frequency detector and to the phase accumulator.

In accordance with another feature of the invention, the further phase delay device comprises dummy decoupling elements in addition to and associated with the time-delay elements for simulating the time-delay conditions corresponding to the time-delay conditions of the PLL phase delay device.

In accordance with a further feature of the invention, the further phase delay device comprises dummy decoupling elements in addition to and associated with the time-delay elements for simulating the time-delay conditions corresponding to the time-delay conditions of the PLL phase delay device.

In accordance with again an added feature of the invention, the dummy decoupling elements are load elements simulating a loading by the input of the M:1 multiplexer of the PLL phase delay device.

In accordance with again an additional feature of the invention, the auxiliary PLL including the further phase-frequency detector is configured with a very high loop bandwidth. Preferably, the auxiliary PLL has a bandwidth in an order of magnitude of a bandwidth of the reference frequency.

With the above and other objects in view there is provided, in accordance with the invention, an integrated digital PLL frequency synthesizer, which comprises the integrated frequency synthesizer outlined above embodied in integrated circuit technology.

Other features which are considered as characteristic for the invention are set forth in the appended claims.

Although the invention is illustrated and described herein as embodied in a digital PLL (Phase-Locked Loop) frequency synthesizer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
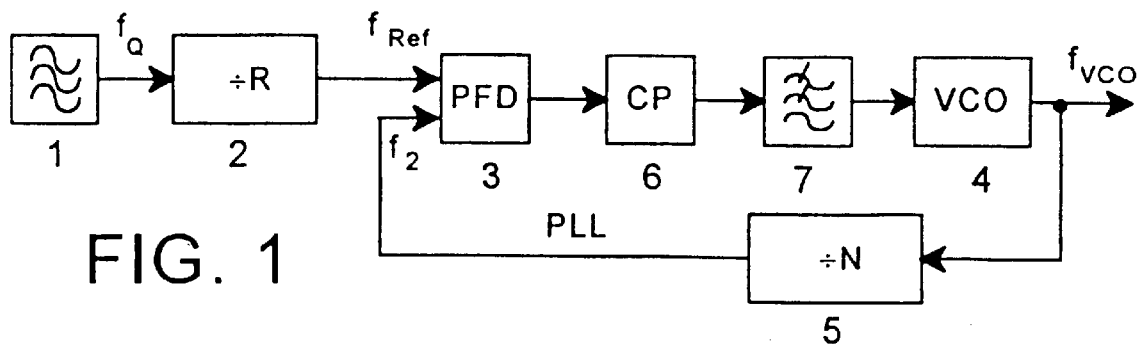
FIG. 1 is a block diagram of a conventional, prior art PLL frequency synthesizer (described in the introductory text above)
Figure 2:
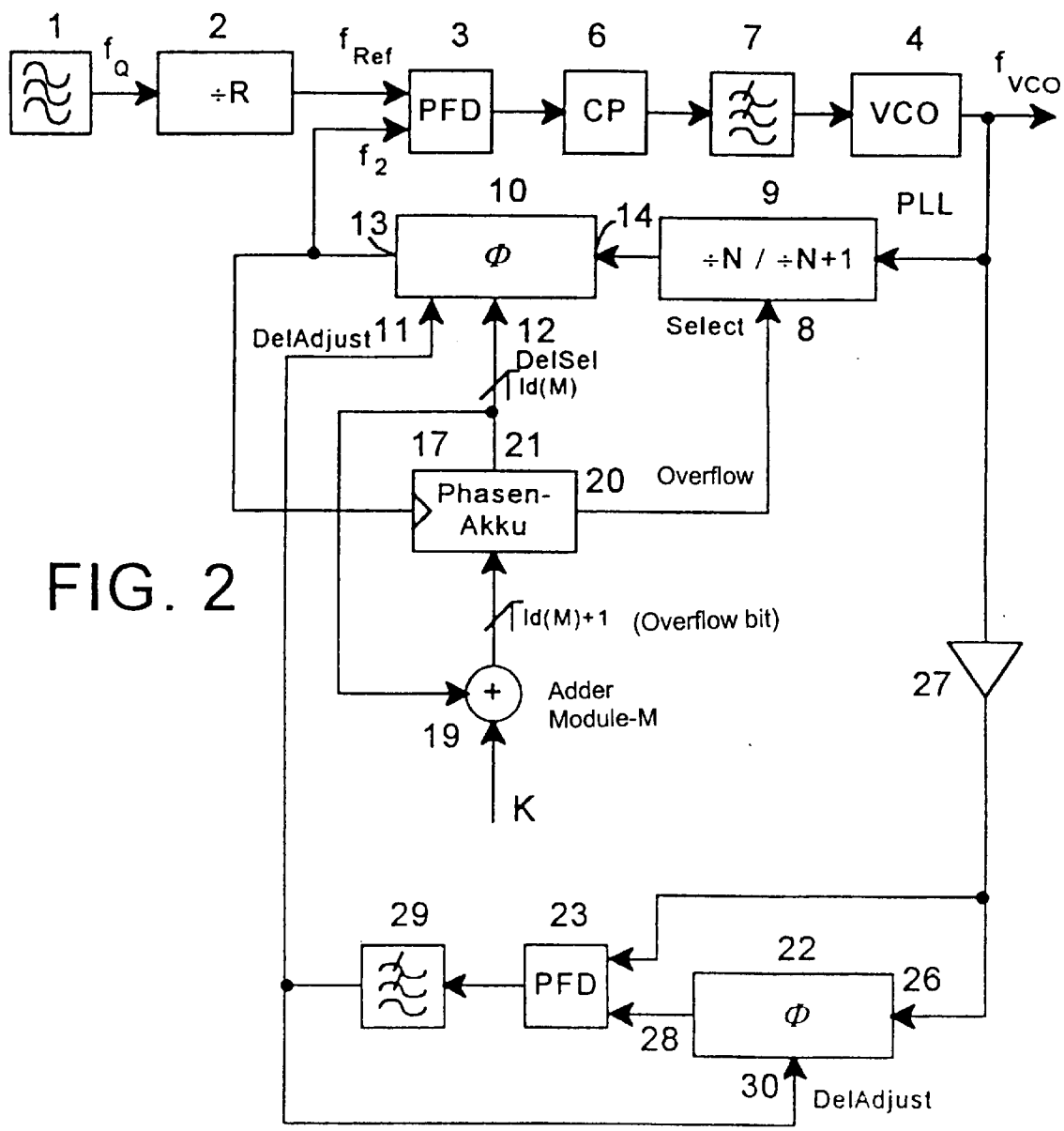
FIG. 2 is a block diagram of a fractional-N PLL frequency synthesizer according to the invention.

Referring now to the figures of the drawing illustrating the invention in detail and first, particularly, to FIG. 2 thereof, there is seen a block diagram of the circuit of a digital PLL (phase-locked loop) frequency synthesizer. Also to be seen in this circuit are the known elements of a conventional PLL frequency synthesizer circuit already described in conjunction with FIG. 1, specifically a crystal-controlled oscillator 1, a reference frequency divider 2, a phase-frequency detector 3, a charge pump 6, a loop low pass filter 7, and a voltage-controlled oscillator (VCO) 4.

In the frequency synthesizer illustrated in FIG. 2, a reference frequency $f_{Ref}$, which is formed in the reference frequency divider 2 by dividing the quartz frequency $f_Q$ supplied by the crystal-controlled oscillator 1, is compared with a second frequency $f_2$, derived by dividing the frequency $f_{VCO}$ of the voltage-controlled oscillator 4, in the phase-frequency detector 3, whose output signal serves in the PLL after being led via the charge pump 6 and the loop low pass filter 7, as control voltage for the voltage-controlled oscillator 4.

By contrast with the prior art frequency synthesizer circuit, described in FIG. 1, in order to divide the frequency of the voltage-controlled oscillator 4, there is provided in the PLL an N/(N+1) frequency divider 9 which can be switched over at a control input 8 (select) between two adjacent integral divisor factors N and N+1, can be programmed in pitch by n and is, as appropriate, implemented using the dual modulus principle.

Likewise other than in the case of the prior art circuit according to FIG. 1, there is further inserted between the frequency divider 9 and the input for the frequency $f_2$ at the phase-frequency detector 3 a phase delay device 10 which has two control inputs 11 (DelAdjust) and 12 (DelSel), respectively. The control input 12 is implemented by a plurality of lines and it may be, for example, a bus with ld(M) lines. A basic time delay is set at the control input 11, and a number of these basic time delays after which the output 13 of the phase delay device 10 follows the input 14 thereof is set at the control input 12.

Figure 3:
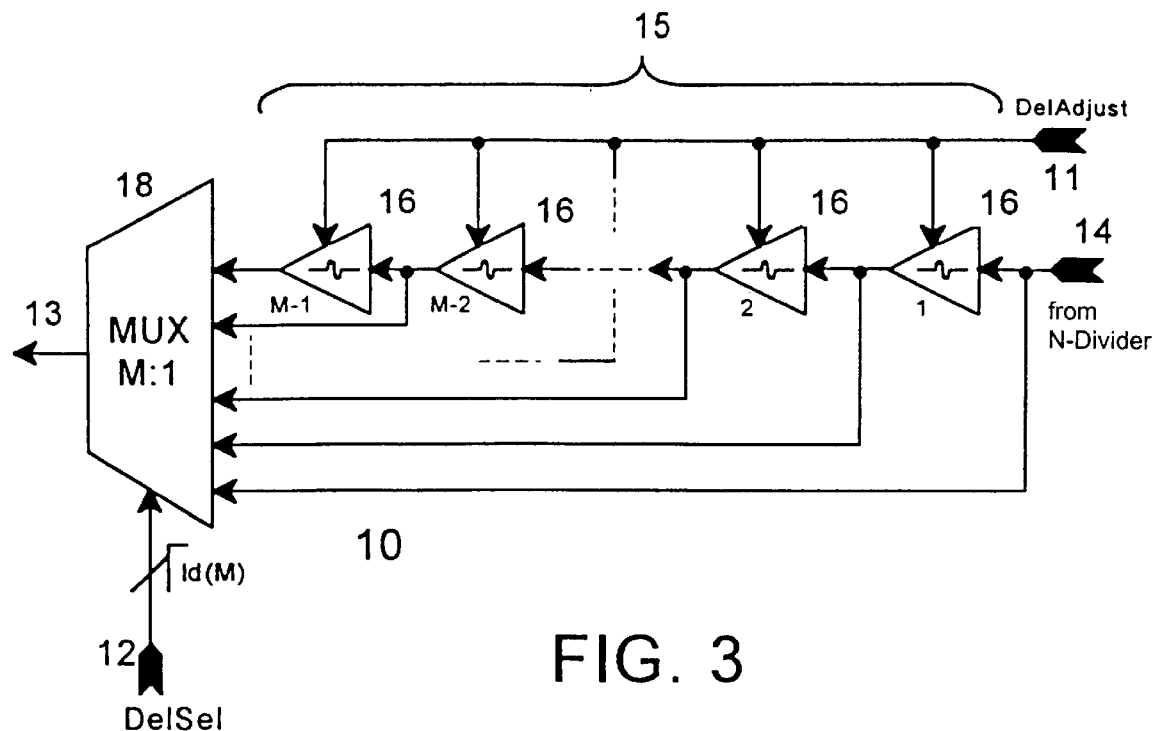
FIG. 3 is a schematic block diagram of the layout of a PLL phase delay device, provided in the circuit of FIG. 2, with M−1 time-delay elements and an M:1 multiplexer.

With reference to FIG. 3, which illustrates in detail the design of the PLL phase delay device 10, the phase delay chain 15 contains—in accordance with the selected modulus M−M−1 time-delay elements 16 which in each case have the same delay time. The delay time can, however, be set via the control input 11. The decoded DelSel signal value from the control input 12 is used to select the time-delay element 16 downstream of which the signal for the phase-frequency detector 3 and a phase accumulator 17 is decoupled.

The control input 12 provided for setting the number of the basic time delays active in the phase delay chain 15 of the PLL phase delay device 10 is simultaneously the control input of an M:1-multiplexer 18 by means of which it is possible to select as a function of the control signal present at its control input downstream of which of the series-connected time-delay elements 16 the signal to be fed, on the one hand, to one input of the phase-frequency detector 3 and, on the other hand, to the phase accumulator 17 is decoupled. The above-mentioned decoding can even be omitted, if appropriate, by the use of a multiplexer in order to select the number of time-delay elements.

With each output pulse of the phase delay device 10, the phase accumulator 17 is increased by the settable fraction K of the reference frequency $f_{Ref}$, although modulo-M, for which reason an adder modulo-M 19 is provided. In the case of an overflow, the N/(N+1) frequency divider 9 is switched to the divisor factor (N+1) for the next period via an overflow output 20 of the phase accumulator 17. The output 21 of the phase accumulator 17 directly provides the control word DelSel for the control input 12 of the PLL phase delay device 10.

As mentioned above, the phase error to be compensated is both a function of the cycle number within M consecutive cycles, and a function of the desired frequency $f_{VCO}$ of the voltage-controlled oscillator 4. It can be shown, and this has already been done, that the required cycle-dependent time for delaying the divided $f_{VCO}$ phase must therefore be an integral multiple of $$T_{delmin}=1/(f_{VCO\text{-}setpoint}*M).$$

An essential step in the method according to the invention is that the control voltage DelAdjust with which this time $T_{delmin}$ is set via the control input 11 at each time-delay element 16 of the phase delay chain 15 in the phase delay device 10 is derived directly from the frequency $f_{VCO}$ of the voltage-controlled oscillator 4 with the aid of a further phase delay device 22 and a further phase-frequency detector 23.

Figure 4:
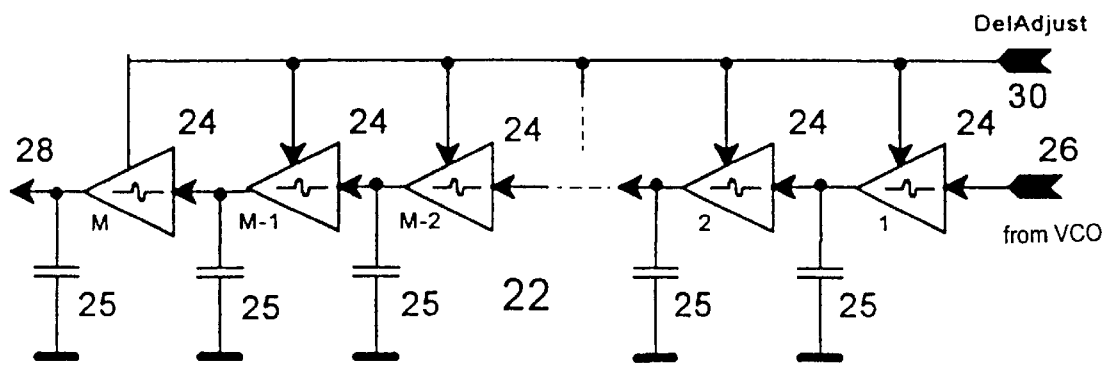
FIG. 4 is a schematic block diagram of the layout of a further phase delay device, provided in the circuit of FIG. 2, with M time-delay elements.

As FIG. 4 shows, the further phase delay device 22 is of exactly the same design as the phase delay device 10, that is to say in accordance with the decoupling lines for the time-delay elements 16 of the phase delay device 10 according to FIG. 3 it is loaded by dummy decoupling elements 25 in the case of all time-delay elements 24, in order to simulate the same time-delay conditions as in the PLL phase delay device 10 fitted with the M:1-multiplexer 18. However, in the further phase delay device 22 it is not, as with the phase delay device 10, M−1 time-delay elements which are connected in series, but M time-delay elements 24, and this is of great significance.

The frequency $f_{VCO}$ of the voltage-controlled oscillator 4 is fed at an input 26 into the further phase delay device 22 via a buffer amplifier 27, and the phase of the signal at the output 28 of the further phase delay device 22 is once again compared, with the aid of the further phase-frequency detector 23, directly to the frequency $f_{VCO}$, led via the same buffer amplifier 26, of the voltage-controlled oscillator 4. The result of comparison, derived from the output 28 of the further phase delay device 22, is subjected to low-pass filtering in a second loop low pass filter 29, and then forms for the further phase delay device 22 the control voltage which is fed there to a control input 30.

This control voltage DelAdjust is used to set the same basic time delay in each case for the time-delay elements 24 on the further phase delay device 22. The further phase delay device 22 is therefore, as it were, a constituent of an auxiliary phase-locked loop (auxiliary PLL) in which the voltage-controlled oscillator 4 generates its own reference frequency. The auxiliary PLL can have a very high loop bandwidth because of the high frequencies.

However, a value which is of the order of magnitude of the reference frequency $f_{Ref}$ suffices, since a substantially faster DelAdjust control signal cannot be more quickly evaluated, in any case. If it is ensured that exactly one VCO period of the oscillation of the voltage-controlled oscillator 4 is contained in the further phase delay device 22, it holds that:

$$T_{22}=M*T_{delmin}=T_{VCO\text{-}setpoint}.$$

This means that each time-delay element 24 of the further phase delay device 22 is delayed by exactly the $M^{th}$ part of $T_{VCO\text{-}setpoint}$.

This is precisely the required elementary value or quantum value of the phase delay chain 15 contained in the actual, that is to say the phase delay device 10 of the main PLL. Because the time-delay elements 16 and 24, respectively, in the two phase delay devices 10 and 22, respectively, are of identical design with reference to their time response, the control voltage for the further phase delay device 22 can also be used as control voltage DelAdjust for the purpose of feeding to the control input 11 of the phase delay device 10.

A frequency synthesizer designed in accordance with the invention can be implemented in a particularly advantageous way using integrated circuit technology.

We claim:

1. A digital PLL frequency synthesizer, comprising:

an input receiving a signal having a stable quartz oscillator frequency;

a voltage-controlled oscillator outputting a VCO frequency;

a first PLL loop connected to an output of said voltage-controlled oscillator and an N/(N+1) frequency divider connected in said first PLL loop for dividing the VCO frequency and generating a divided VCO frequency;

a phase-frequency detector having a first input receiving the stable quartz oscillator frequency and a second input receiving the divided VCO frequency, and configured to compare the quartz oscillator frequency with the divided VCO frequency, and outputting an output signal connected as a control voltage for said voltage-controlled oscillator;

said N/(N+1) frequency divider being configured to be switched over between two adjacent integral divisor factors N and N+1, to divide by N for a duration of M−K cycles, and to divide by N+1 for a duration of K cycles;

a phase accumulator connected to said N/(N+1) frequency divider for automatically switching said N/(N+1) frequency divider, wherein a content of said phase accumulator has added thereto the value K with a modulo-M addition with each pulse of the divided VCO frequency and said phase accumulator causing a change in the divisor factor from N to N+1 in a next cycle after each overflow;

a PLL phase delay device connected between said N/(N+1) frequency divider and said second input of said phase frequency detector and to said phase accumulator, said phase delay device containing M−1 time-delay elements in a phase delay chain and having first and second control inputs, said first control input for setting a respectively corresponding magnitude of a fundamental delay of each said time-delay element of said phase delay chain, and said second control input for setting a number of the fundamental delays to be active in said phase delay chain, wherein the contents of said phase accumulator are increased with each output pulse of said phase delay device by the adjustable fraction K of the reference frequency modulo-M, and wherein, in event of an overflow, said N/(N+1) frequency divider is switched to N+1 for a next period;

said phase accumulator having an output connected to said second control input of said phase delay device;

a further phase frequency detector having a first input, a second input connected to said output of said voltage-controlled oscillator without an interposition of a time-delay element, and an output;

a further phase delay device for simulating corresponding time-delay conditions, configured identically to said PLL phase delay device, but having a number M series-connected time-delay elements, and connected between said output of said voltage-controlled oscillator and said first input of said further phase-frequency detector; and a further loop low pass filter connected between said output of said further phase frequency detector and said first control input of said PLL phase delay device and a control input of said further phase delay device for forming an auxiliary PLL and for setting a respectively corresponding magnitude of the fundamental delays of said time-delay elements of said PLL phase delay device and said further phase delay device.

2. The digital PLL frequency synthesizer according to claim 1, which further comprises a charge pump and a loop low-pass filter connected in said first PLL loop.

3. The frequency synthesizer according to claim 1, wherein said second control input for setting the number of the fundamental delays active in the phase delay device is formed by a control input of an M:1 multiplexer, whereby said multiplexer selects, in dependence on a control signal present at a control input thereof, the output signal of which of the series-connected time-delay elements is decoupled and fed to said second input of said first phase-frequency detector and to said phase accumulator.

4. The frequency synthesizer according to claim 1, wherein said further phase delay device comprises dummy decoupling elements in addition to and associated with said time-delay elements for simulating the time-delay conditions corresponding to the time-delay conditions of said PLL phase delay device.

5. The frequency synthesizer according to claim 3, wherein said further phase delay device comprises dummy decoupling elements in addition to and associated with said time-delay elements for simulating the time-delay conditions corresponding to the time-delay conditions of said PLL phase delay device.

6. The frequency synthesizer according to claim 5, wherein said dummy decoupling elements are load elements simulating a loading by the input of said M:1 multiplexer of said PLL phase delay device.

7. The frequency synthesizer according to claim 1, wherein said auxiliary PLL including said further phase-frequency detector is configured with a very high loop bandwidth.

8. The frequency synthesizer according to claim 7, wherein said auxiliary PLL has a bandwidth in an order of magnitude of a bandwidth of the frequency.

9. An integrated digital PLL frequency synthesizer, which comprises the integrated frequency synthesizer according to claim 1 embodied in integrated circuit technology.

* * * * *